(12) United States Patent
Takasawa et al.

(10) Patent No.: US 8,679,306 B2
(45) Date of Patent: Mar. 25, 2014

(54) SPUTTERING APPARATUS

(75) Inventors: Satoru Takasawa, Sammu (JP);
Sadayuki Ukishima, Sammu (JP);
Noriaki Tani, Sammu (JP); Satoru Ishibashi, Sammu (JP)

(73) Assignee: Ulvac, Inc., Chigasaki-Shi (JP)

( * ) Notice: Subject to any disclaimer, the term of this patent is extended or adjusted under 35 U.S.C. 154(b) by 1436 days.

(21) Appl. No.: 11/987,934

(22) Filed: Dec. 6, 2007

(65) Prior Publication Data
US 2008/0210556 A1    Sep. 4, 2008

Related U.S. Application Data

(63) Continuation of application No. PCT/JP2006/319963, filed on Oct. 5, 2006.

(30) Foreign Application Priority Data

Oct. 18, 2005 (JP) .................................. 2005-303491

(51) Int. Cl.
*C23C 14/35* (2006.01)
(52) U.S. Cl.
USPC .............................. 204/298.18; 204/298.19
(58) Field of Classification Search
USPC ........................................ 204/298.18, 298.19
See application file for complete search history.

(56) References Cited

U.S. PATENT DOCUMENTS 4,842,708 A * 6/1989 Kadokura et al. ........ 204/298.16
5,181,020 A * 1/1993 Furukawa et al. ............ 340/551

FOREIGN PATENT DOCUMENTS

| JP | 61-183466 | 8/1986 |
| JP | 61-243168 | 10/1986 |
| JP | 62-211374 | 9/1987 |
| JP | 63-277756 | 11/1988 |
| JP | 64-055379 | 3/1989 |
| JP | 11-162652 | 6/1999 |
| JP | 2005-32618 | 2/2005 |

OTHER PUBLICATIONS

International Search Report dated Jan. 9, 2007.

* cited by examiner

*Primary Examiner* — Rodney McDonald
(74) *Attorney, Agent, or Firm* — Kratz, Quintos & Hanson, LLP

(57) ABSTRACT

A sputtering apparatus with high usage efficiency of a target is provided. A sputtering apparatus of the present invention includes first and second ring magnets, first and second magnet members arranged inside a ring of the first and second ring magnets, wherein in the first and second ring magnets and the first and second magnet members, magnetic poles with the same magnetism are faced toward the rear surface of a first and a second targets. Thus, in the rear surface of the first and second targets, the magnetic poles with the same polarity are adjacently arranged, and the absolute value of the strength of horizontal magnetic field components formed in the surfaces of the first and second targets becomes small and the strength distribution becomes narrow, and the strength of vertical magnetic field components becomes uniform; and consequently, a non-erosion portion is not produced in the first and second targets.

2 Claims, 9 Drawing Sheets

SPUTTERING APPARATUS

The present invention is a Continuation of International Application No. PCT/JP2006/319963 filed Oct. 5, 2006, which claims priority to Japan Patent Document No. 2005-303491, filed on Oct. 18, 2005. The entire disclosures of the prior applications are hereby incorporated by reference herein in their entireties.

BACKGROUND

The present invention generally relates to sputtering apparatuses.

Recently, there has been increasing interest in organic EL element as a display device.

FIG. 12 is a schematic cross-sectional view for illustrating the structure of an organic EL device 201.

This organic EL device 201 has a lower electrode 214, organic layers 217, 218, and an upper electrode 219 laminated in this order on a substrate 211; and light emission occurs within the organic layers 217, 218 or at the interface between the organic layers 217, 218 if a voltage is applied to between the upper electrode 219 and the lower electrode 214. If the upper electrode 219 is composed of a transparent conductive film (such as, an ITO film (indium tin oxide film)), the luminescent light is transmitted through the upper electrode 219 and emitted to the outside.

As the method of forming the upper electrode 219 as described above, a vapor deposition method is mainly used.

In the vapor deposition method, particles emitted from a deposition source due to the sublimation or evaporation are neutral particles with a low energy (approximately several eV), so there is the advantage of forming an excellent interface without damaging the organic layers 217, 218 when forming a protective film of the upper electrode 219 and organic EL device.

However, since films formed with the vapor deposition method have poor adhesion to the organic layer, problems occur, such problems including the generation of dark spots and the exfoliation of electrodes due to the long-term drive. Moreover, from the viewpoint of productivity, the vapor deposition method has problems, including the difficulty in ensuring a film thickness distribution in a large area due to a point evaporation source, and a short maintenance cycle due to the deterioration of an evaporation boat and the difficulty in continuously supplying evaporation materials.

As ways to solve the above-described problems, the way of a sputtering method has been proposed. However, in a parallel plate type sputtering method in which an object to be film-formed is made to face the surface of a target, when an aluminum upper electrode is formed on the organic layer, problems occur in the driving test of the organic EL devices. Such problems include luminescence starting voltage becoming extremely high or no light being emitted. These problems occur because in the sputtering method, the charged particles (Ar ions, secondary electrons, recoil Ar) in plasma and the sputtered particles with a high kinetic energy are irradiated upon the organic layer, thereby destroying the interface between the organic layers and thus failing to favorably inject electrons.

Consequently, also in the conventional art, countermeasures have been sought and a sputtering apparatus 110 as shown in FIG. 13 has been proposed.

This sputtering apparatus 110 has a vacuum chamber 111; and in the vacuum chamber 111, two targets 121a, 121b are opposingly arranged in parallel while the rear surfaces thereof are attached to backing plates 122a, 122b, respectively; and the front surfaces thereof are spaced from each other by a certain distance.

Magnetic field forming devices 115a, 115b are arranged on the rear surfaces of the backing plates 122a, 122b, respectively. The magnetic field forming devices 115a, 115b are constructed by attaching ring-shaped magnets 123a, 123b to yokes 129a, 129b, respectively.

Each of the magnets 123a, 123b is arranged with one of the magnetic poles being faced toward the target 121a, 121b and the other magnetic pole being faced toward the direction opposite to the target and in two magnets 123a, 123b the magnetic poles with different polarities are faced toward the targets 121a, 121b, respectively.

In short, since one magnet 123a faces the N pole toward the target 121a and the other magnet 123b faces the S pole toward the target 121b, magnetic lines of force 131 are generated between the two magnets 123a, 123b. Since the magnets 123a, 123b are ring-shaped, the magnetic lines of force generated between the magnets 123a, 123b become cylindrical (FIG. 14).

When the inside of the vacuum chamber 111 is evacuated by a vacuum evacuating system 116 and a sputtering gas is introduced from a gas introduction system 117 and voltage is applied to the targets 121a, 121b, a plasma of the sputtering gas is generated in a space sandwiched between the targets 121a, 121b; and thus, the surfaces of the targets 121a, 121b are sputtered.

An object to be film-formed 113 is arranged lateral to the space sandwiched between the targets 121a, 121b, and a thin film is formed on the surface of the object to be film-formed 113 by the sputtered particles that are diagonally emitted from the targets 121a, 121b and are discharged into the vacuum chamber 111.

In this sputtering apparatus 110, the space in which the targets 121a, 121b face each other is surrounded by the cylindrical magnetic lines of force 131 formed in between two magnets 123a, 123b, and the plasma is confined by the magnetic lines of force 131; and for this reason the plasma does not leak out to the object to be film-formed 113. Accordingly, the object to be film-formed 113 does not get exposed to the charged particles in the plasma; and thus, the organic thin film exposed on the surface of the object to be film-formed 113 is not damaged.

However, in the above-described sputtering apparatus 110, a phenomenon occurs whereby the center portions of the targets 121a, 121b are eroded deeper than their edge portions by sputtering.

Since an abnormal discharge occurs if the targets 121a, 121b are eroded so deep that the backing plates 122a, 122b at the rear surface side of the targets get exposed, the targets 121a, 121b are replaced before the backing plates 122a, 122b get exposed.

If only a part of the targets 121a, 121b is deeply eroded, the targets 121a, 121b have to be replaced even if the decreased amount of the film thickness in the other part is small; and thus, the usage efficiency of the target in the conventional sputtering apparatus 110 is poor.

See, Patent Documents No. JPA 11-162652 and JPA 2005-032618.

SUMMARY OF THE INVENTION

The present invention has been made to solve the above-described problems and is intended to improve the usage efficiency of targets.

As the results of studies for improving the usage efficiency of a target, the present inventors found that if among the strength of magnetic fields formed in the surface of the target, the strength of the component horizontal to the surface of the target is −100 gauss or more and +100 gauss or less, or the difference between an upper limit and a lower limit of the strength of the component perpendicular to the surface of the target is 100 gauss or less, the target is sputtered uniformly.

According to an aspect of the present invention made based on such findings, a sputtering apparatus includes a vacuum chamber, first and second plate-shaped targets, first and second ring magnets that are ring-shaped and are magnetized in the thickness direction of the ring. The first and second targets are arranged spaced apart at a predetermined distance in the vacuum chamber while the surfaces of the first and second targets are faced so as to be in parallel to each other; and the first and second ring magnets are arranged at a position of the rear surfaces of the first and second targets. If either S pole or N pole is set to a first magnetic pole and the other is set to a second magnetic pole, then in the first ring magnet the first magnetic pole is faced toward the rear surface side of the first target, and in the second ring magnet the second magnetic pole is faced toward the rear surface side of the second target, and sputtered particles are discharged from an opening of a space between the first and second targets toward a surface of an object to be film-formed. A first magnet member, in which the first magnetic pole is faced toward the rear surface of the first target, is arranged inside the ring of the first ring magnet; and a second magnet member, in which the second magnetic pole is faced toward the rear surface of the second target, is arranged inside the ring of the second ring magnet, and wherein among the strength of magnetic fields formed in the surfaces of the first and second targets, an absolute value of the strength of horizontal magnetic field components parallel to the surface of the first and second targets is set to at most 100 gauss.

According to another aspect of the present invention, a sputtering apparatus includes a vacuum chamber, first and second plate-shaped targets, and first and second ring magnets that are ring-shaped and are magnetized in the thickness direction of the ring wherein the first and second targets are arranged spaced apart at a predetermined distance in the vacuum chamber while the surfaces thereof are faced so as to be in parallel to each other. The first and second ring magnets are arranged at a position of the rear surfaces of the first and second targets. If either S pole or N pole is set to a first magnetic pole and the other is set to a second magnetic pole, then in the first ring magnet the first magnetic pole is faced toward the rear surface side of the first target; and in the second ring magnet the second magnetic pole is faced toward the rear surface side of the second target. Sputtered particles are discharged from an opening of a space between the first and second targets toward a surface of an object to be film-formed. A first magnet member, in which the first magnetic pole is faced toward the rear surface of the first target, is arranged inside the ring of the first ring magnet; a second magnet member, in which the second magnetic pole is faced toward the rear surface of the second target, is arranged inside the ring of the second ring magnet; and wherein among the strength of magnetic fields formed in the surfaces of the first and second targets, a difference between an upper limit and lower limit of the strength of vertical magnetic field components perpendicular to the surfaces of the first and second targets is set to at most 100 gauss.

According to yet another aspect of the present invention, in the sputtering apparatus according to this invention, the first and second ring magnets and the first and second magnet members are relatively stationary with respect to the first and second targets.

Since the present invention is configured as described above and the absolute value of the strength of horizontal magnetic field formed in the surfaces of the first and second targets is set to at most 100 gauss, each portion of the first and second targets is sputtered uniformly. Accordingly, the erosion area expands even if the first and second magnet members are held stationary with respect to the first and second targets.

According to the sputtering apparatus of the present invention, the erosion area is large even if the first and second magnet members are held relatively stationary with respect to the first and second targets without being moved. Thus, a mechanism or device to move the first and second magnet members is not required, thereby simplifying the structure of the apparatus. In addition, 100 gauss is converted to 10 mT, wherein T (tesla) is the SI unit.

In addition, the first and second targets used in the present application are plate-shaped and the surface of the first and second targets is flat at least before being sputtered. Although in the first and second targets, a recess is formed in a portion eroded by sputtering, in the present invention the surface of a target is referred to as the flat surface before being sputtered. Accordingly, a horizontal magnetic field component is a magnetic field component parallel to the flat surface before being sputtered; and a vertical magnetic field component is a magnetic field component perpendicular to the flat surface before sputtering.

Since the strength distribution of the horizontal magnetic field components formed above the surfaces of the first and second targets is so narrow that the absolute value thereof is 100 gauss or less, the surfaces of the first and second targets are sputtered uniformly. Accordingly, in each portion of the first and second targets, the film thickness decreases uniformly so the usage efficiency of the first and second targets is high.

DETAILED DESCRIPTION OF THE PREFERRED EMBODIMENTS

Figure 1:
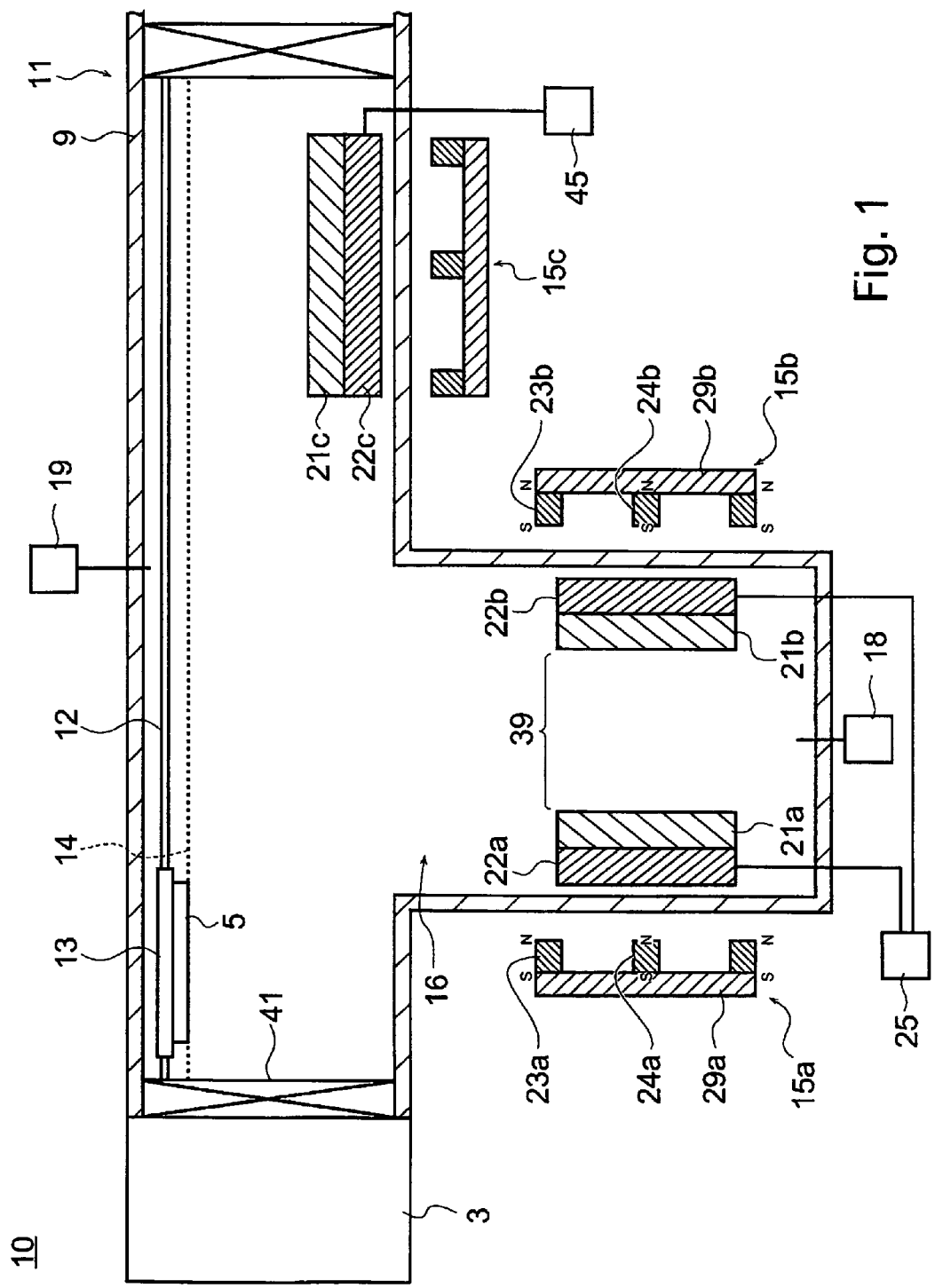
FIG. 1 is a cross-sectional view of a sputtering apparatus of the present invention.

Reference numeral 1 in FIG. 1 represents a sputtering apparatus as one embodiment according to the present invention.

This sputtering apparatus 1 is a vertical interback-type apparatus and includes a vacuum chamber 11. The vacuum chamber 11 includes a transporting chamber 9, and a sputtering chamber 16 connected to the transporting chamber 9.

In the sputtering chamber 16, two backing plates 22a, 22b are arranged in such a manner that they are spaced apart from each other; and first and second targets 21a, 21b are attached to the surfaces thereof, respectively.

The first and second targets 21a, 21b are plate-shaped, and the surfaces thereof are spaced apart at a predetermined distance and are parallel to each other.

The surfaces of the first and second targets 21a, 21b face each other, and a sputtering space is formed in a space between the surface of the first target 21a and the surface of the second target 21b.

A vacuum evacuating system 19 and a gas supply system 18 are connected to the vacuum chamber 11; and after evacuating the inside of the vacuum chamber 11 and forming a vacuum atmosphere in the vacuum chamber 11 by the vacuum evacuating system 19, a sputtering gas is introduced from the gas supply system 18 to thereby form a deposition atmosphere of a predetermined pressure in the sputtering space.

A power supply 25 is arranged outside the vacuum chamber 11, and the power supply 25 is connected to the backing plates 22a, 22b but not connected to the vacuum chamber 11; and if a voltage is applied to the backing plates 22a, 22b from the power supply 25 with the vacuum chamber 11 being maintained at the ground potential while maintaining the deposition atmosphere, then a plasma is generated in the sputtering space and the first and second targets 21a and 21b are sputtered and then the sputtered particles are discharged to the sputtering space from the surfaces of the first and second targets 21a, 21b.

The first and second targets 21a, 21b are rectangular, and one long side out of the two long sides is faced toward the transporting chamber 9 and the other long side is faced toward the opposite side of the transporting chamber 9. The two long sides that face toward the transporting chamber 9 are positioned in the same plane; and an opening 39 of the sputtering space is formed in a portion between these two long sides.

The transporting chamber 9 is provided with a linear transporting path 14. When a gate valve 41 is opened to transport the object to be film-formed 5 from an L/UL chamber 3 into the transporting chamber 9 and a carrier 13 is caused to hold the object to be film-formed 5 and the carrier 13 is transported by the transporting mechanism 12, then the object to be film-formed 5 moves along the transporting path 14.

The transporting path 14 is parallel to the opening 39 and is extended to the direction perpendicular to the surfaces of the first and second targets 21a, 21b; and from the opening 39, the sputtered particles are discharged uniformly to the downstream side and upstream side of the transporting path 14.

The transporting path 14 is extended in such a manner that the object to be film-formed 5 passes through a position facing the opening 39 and in parallel with the opening 39, and when the object to be film-formed 5 moves from the upstream side to the downstream side along the transporting path 14, the sputtered particles discharged from the opening 39 reach the object to be film-formed 5 in a uniform manner.

The distance between two sides forming the opening 39 is narrow, and when an angle which the surfaces of the first and second targets 21a, 21b and the direction at the time of ejecting from these surfaces form is referred to as an ejection angle, only the sputtered particles with a small ejection angle are discharged from the opening 39 to reach the surface of the object to be film-formed 5. The material (e.g., organic layer or the like) exposed to the surface of the object to be film-formed 5 is not damaged by the sputtered particles because the amount of energy of the sputtered particles with a small ejection angle is small.

At a position of the rear surface of the first and second targets 21a, 21b in the outside of the vacuum chamber 11, first and second magnetic field forming devices 15a, 15b, respectively, are arranged, and the first and second magnetic field forming devices 15a, 15b include first and second ring magnets 23a, 23b and first and second magnet members 24a, 24b, respectively.

The first and second ring magnets 23a, 23b are in the shape of a thin plate ring, and the first and second magnet members 24a, 24b are in the shape of a thin plate with the thickness similar to that of the first and second ring magnets 23a, 23b.

At the position of the rear surfaces of the first and second targets 21a, 21b in the outside of the vacuum chamber 11, plate-shaped yokes 29a, 29b are arranged with the surfaces thereof being faced toward the first and second targets 21a, 21b, respectively; and the first and second ring magnets 23a, 23b are arranged with the surfaces thereof being faced toward the rear surface of the first and second targets 21a, 21b, respectively, and with the rear surfaces thereof being fixed to the surfaces of the yokes 29a, 29b, respectively.

The first and second magnet members 24a, 24b are made smaller than the inner periphery of the ring of the first and second ring magnets 23a, 23b; and the first and second magnet members 24a, 24b are arranged inside the ring of the first and second ring magnets 23a, 23b, with the surfaces thereof being faced toward the first and second targets 21a, 21b and with the rear surfaces thereof being fixed to the yokes 29a, 29b.

The first and second ring magnets 23a, 23b and the first and second magnet members 24a, 24b are magnetized in the thickness direction, respectively, and the magnetic poles of the magnets 23a, 23b, 24a, and 24b are formed in the surfaces faced toward the rear surfaces of the first and second targets 21a, 21b and in the rear surfaces fixed to the yokes 29a, 29b, respectively.

When among the formed magnetic poles, the magnetic poles located in the faces faced toward the rear surfaces of the first and second targets 21a, 21b are referred to as target side magnetic poles, then the target side magnetic poles of the first ring magnet 23a and first magnet member 24a exhibit the same magnetism; and similarly, the target side magnetic poles of the second ring magnet 23b and second magnet member 24b exhibit the same magnetism. However the magnetism of the target side magnetic poles of the first ring magnet 23a and first magnet member 24a is different from the magnetism of the target side magnetic poles of the second ring magnet 23b and second magnet member 24b.

Accordingly, in the first magnetic field forming device 15a and second magnetic field forming device 15b, the same magnetic pole is faced toward the rear surfaces of the first and second targets 21a, 21b, respectively. However, the target side magnetic pole of the first magnetic field forming device 15a and the target side magnetic pole of the second magnetic field forming device 15b are set to the magnetic poles different from each other.

When either one of the S pole and the N pole is referred to as a first magnetic pole and the other one is referred to as a second magnetic pole, if the target side magnetic pole of the first magnetic field forming device 15a is the first magnetic pole, then the target side magnetic pole of the second magnetic field forming device 15b is the second magnetic pole.

Figure 2:
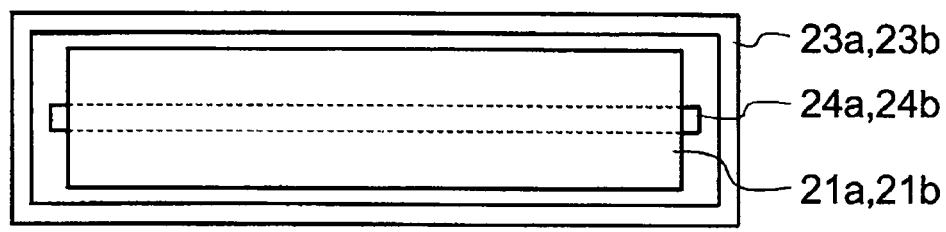
FIG. 2 is a plan view for illustrating a positional relationship between first and second ring magnets and magnet members.

The first and second ring magnets 23a, 23b have the same shape, and the size thereof is larger than that of the first and second targets 21a, 21b; and the sides constituting the first and second ring magnets 23a, 23b extend beyond the edges of the first and second targets 21a, 21b and are spaced from the outer periphery of the first and second targets 21a, 21b by a certain distance (FIG. 2).

Figure 3:
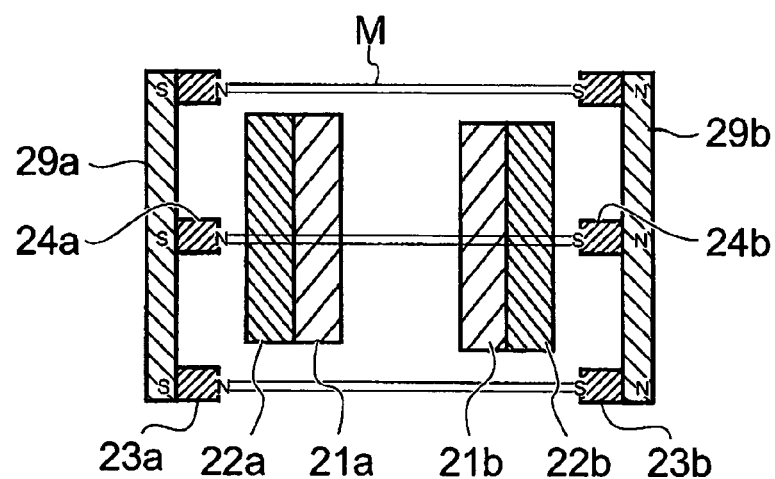
FIG. 3 is a cross-sectional view for illustrating magnetic field components.

Thus, the first and second ring magnets 23a, 23b face each other with the walls of the vacuum chamber 11 being interposed therebetween; and cylindrical magnetic lines of force M are formed between the first and second ring magnets 23a, 23b, and the first and second targets 21a, 21b are located in these cylindrical magnetic lines of force M (FIG. 3).

Since the plasma generated in the above-described sputtering space is confined in the cylindrical magnetic lines of force M, the charged particles in the plasma do not reach the object to be film-formed 5. Accordingly, a first thin film is formed on the surface of the object to be film-formed 5 without the material (for example, organic layer) exposed to the surface of the object to be film-formed 5 being damaged.

Moreover, the first and second magnet members 24a, 24b also have the same shape; and the first and second magnet members 24a, 24b are positioned so as to face each other with the vacuum chamber 11 and the first and second targets 21a, 21b being interposed therebetween.

Figure 8:
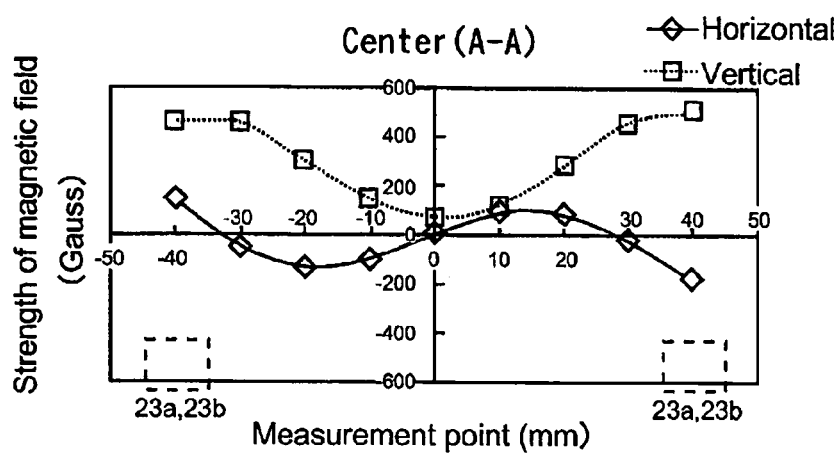
FIGS. 8(a) to 8(c) are graphs for showing distributions of magnetic field strength of the comparative example.
Figure 8:
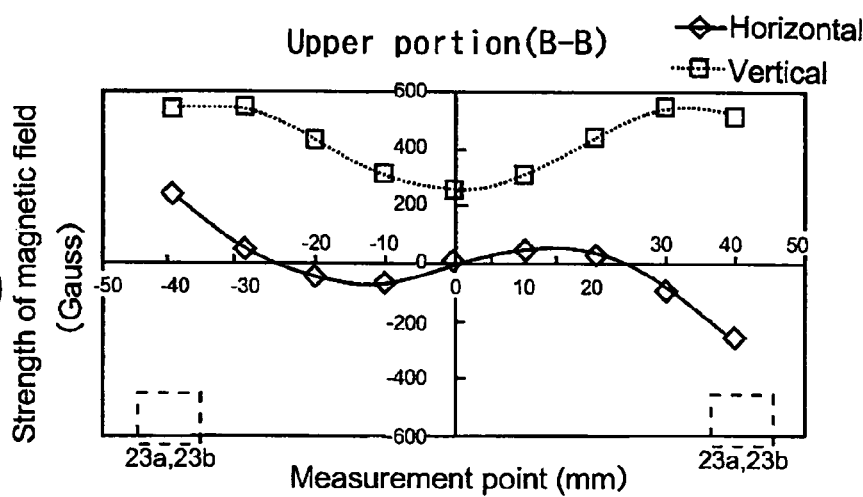
Figure 8:
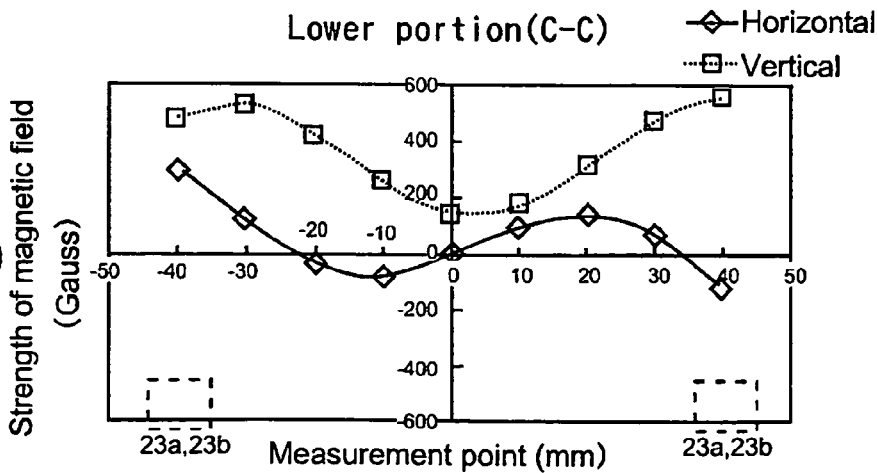
Figure 14:
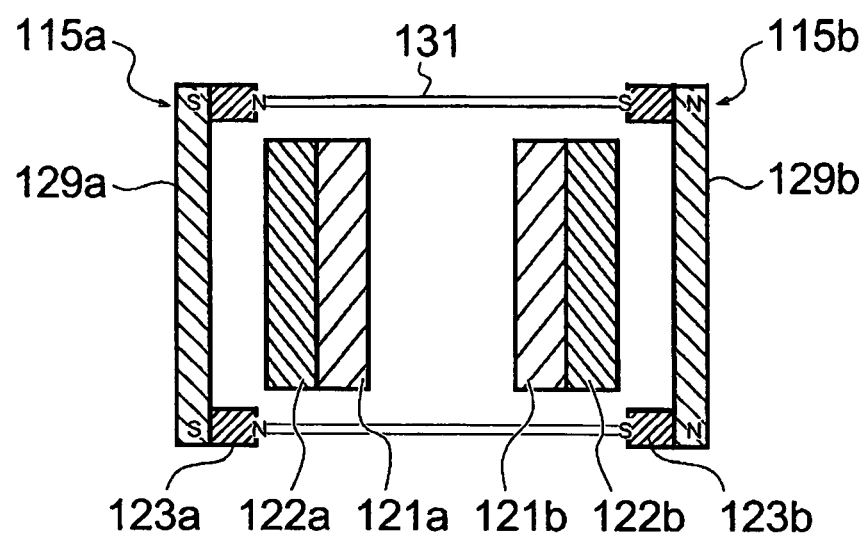
FIG. 14 is a cross-sectional view for illustrating magnetic field components of the sputtering apparatus according to the conventional art.

When among the magnetic field components formed in the surfaces of the first and second targets 21a, 21b, a component parallel to these surfaces is referred to as a horizontal magnetic field component and a component perpendicular to these surfaces is referred to as a vertical magnetic field component. In the case where the first and second magnet members 24a, 24b are not arranged inside the ring of the first and second ring magnets 23a, 23b as in the conventional art shown in FIG. 14, the strength of the horizontal magnetic field component becomes nonuniform as shown in FIG. 8 and as described later. Furthermore, the strength of the vertical magnetic field component is small in the vicinity of the center of the target and becomes large at the end portion of the targets. Therefore, the difference between the upper limit and lower limit thereof is large, as shown in FIG. 8 and as described later.

Figure 7:
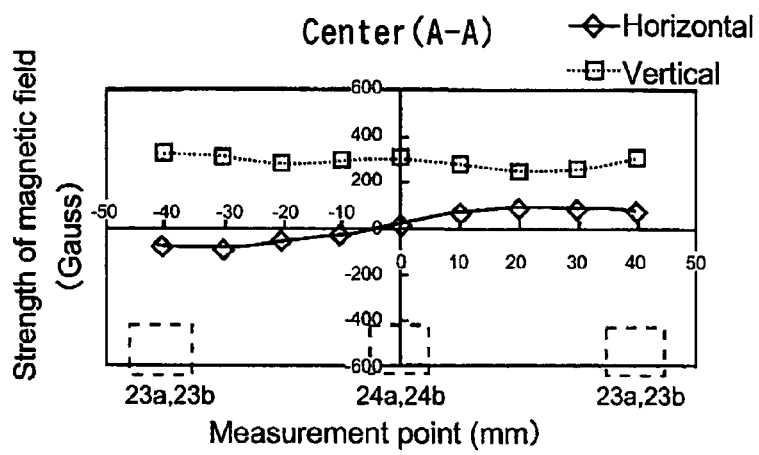
FIGS. 7(a) to 7(c) are graphs for showing distributions of magnetic field strength of the embodiment.
Figure 7:
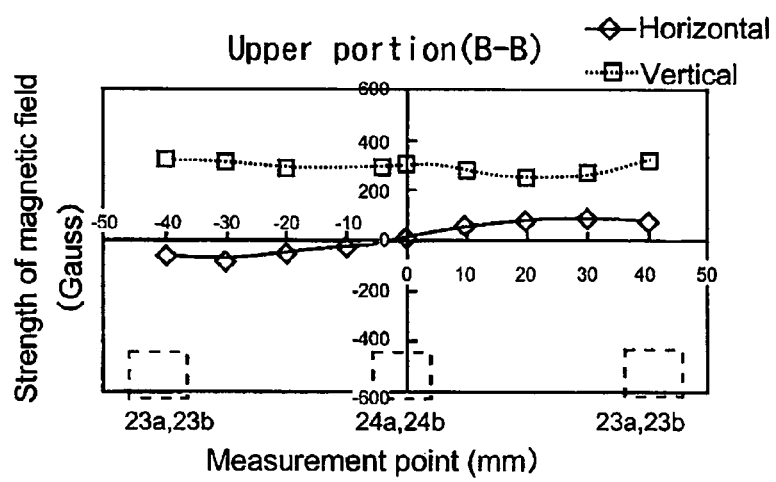
Figure 7:
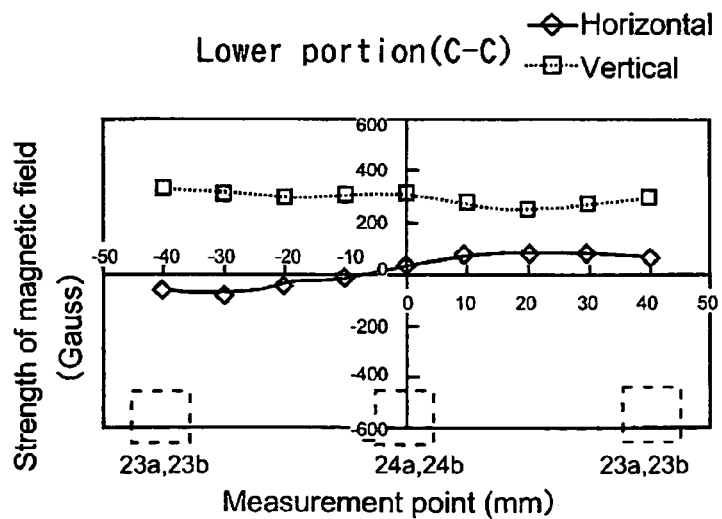

In contrast, in the present embodiment, as shown in FIG. 3, by arranging the first and second magnet members 24a, 24b inside the ring of the first and second ring magnets 23a, 23b, the strength of the horizontal magnetic field component reaches the near zero value and the difference between the upper limit and the lower limit of the strength of the vertical magnetic field components decreases, as shown in FIG. 7 and as described later.

The strengths of the individual magnet 23a, 23b, 24a, and 24b, the radii of the ring of the first and second ring magnets 23a, 23b, the widths of the ring of the first and second ring magnets 23a, 23b, the widths of the first and second magnet members 24a, 24b, and the distances from the magnetic poles at the first and second targets 21a, 21b sides of the first and second magnetic field forming devices 15a, 15b to the first and second targets 21a, 21b are set so that the magnetic field strength of the horizontal magnetic field components are distributed in the range of −100 gauss or more and 100 gauss or less; and also, the difference between the upper limit and the lower limit of the vertical magnetic field components becomes 100 gauss or less. As a result, the first and second targets 21a, 21b are sputtered uniformly.

In the downstream side of the transporting path 14 from the portion to which the sputtering chamber 16 is connected in the transporting chamber 9, a third target 21c attached to a backing plate 22c is arranged.

A third magnetic field forming device 15c is arranged at the rear surface side of the third target 21c, and the third magnetic field forming device 15c forms, in a surface of the third target 21c magnetic lines of force, the magnetic lines of force being parallel to this surface. When a voltage is applied to the third target 21c from a power supply 45 with the vacuum chamber 11 being maintained at the earth potential, then the surface of the third target 21c is sputtered highly efficiently by the above-described parallel magnetic lines of force.

The surface of the third target 21c is faced toward the transporting path 14 and is constructed so that the object to be film-formed 5 passes through a position facing the third target 21c; and thus, the sputtered particles vertically emitted from the third target 21c do not reach the object to be film-formed 5.

At this time, on the surface of the object to be film-formed 5, the first thin film is already formed by the first and second targets 21a, 21b, and the sputtered particles of the third target 21c are irradiated upon the surface of the first thin film, thereby forming a second thin film without damaging a thin film below the first thin film.

The sputtered particles for forming the second thin film are particles vertically emitted from the surface of the third target 21c and are more abundant as compared to the quantity of the sputtered particles that are irradiated from the first and second targets 21a, 21b; and the deposition rate of the second thin film is high as compared to that of the first thin film.

For example, the first to third targets 21a-21c are transparent conductive materials (such as, ITO), and the first and second thin films are thin films of the transparent conductive material, respectively; and a layer of transparent conductive film composed of the first and second thin films is formed in the surface of the object to be film-formed 5.

Moreover, if the constituent material of the third target 21c is composed of a material different from that of the first and second targets 21a, 21b, a thin film with a two-layer structure is formed on the surface of the object to be film-formed 5.

The shape and arrangement of the first and second ring magnets 23a, 23b and the shape and arrangement of the first and second magnet members 24a, 24b are not limited in particular. However, with respect to one of the embodiments, as shown in FIG. 2, the ring shape of the first and second ring magnets 23a, 23b is elongated-elliptical or elongated-square, and the first and second magnet members 24a, 24b have an elongated shape with the same width as that of the ring of the first and second ring magnets 23a, 23b and are arranged in such a manner that the entire outer periphery thereof is spaced apart from the edge of the inner periphery of the first and second ring magnets 23a, 23b.

If the first and second magnet members 24a, 24b are arranged along the longitudinal direction of the ring of the first and second ring magnets 23a, 23b, then in a large area along the longitudinal direction of the first and second ring magnets 23a, 23b, the strength of the horizontal magnetic field component can be made nearly zero and the strength distribution of the vertical magnetic field components can be narrowed.

The foregoing description has been made in a case where the first and second magnet members 24a, 24b are not in contact with the first and second ring magnets 23a, 23b, but the present invention is not limited thereto. For example, as shown in FIG. 4(a), the end portion (here, both end portions) in the longitudinal direction of first and second magnet members 44a, 44b may be contacted with the edge of the inner periphery of the ring of the first and second ring magnets 23a, 23b.

Figure 4:
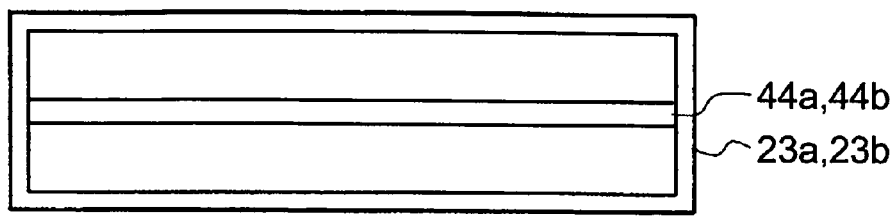
FIGS. 4(a) to 4(c) are plan views for illustrating other examples of the first and second magnet members.
Figure 4:
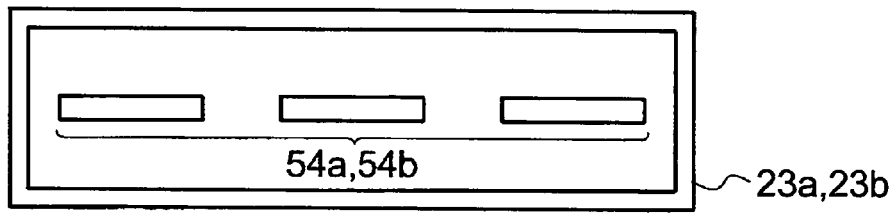
Figure 4:
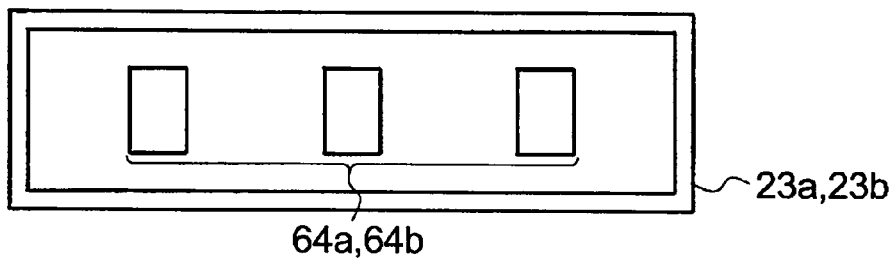

Moreover, as shown in FIG. 4(b), the first and second magnet members 54a, 54b may be divided into plural parts and the divided parts of the first and second magnet members 54a, 54b may be arranged in the line along the longitudinal direction of the ring of the first and second ring magnets 23a, 23b, respectively.

Moreover, as shown in FIG. 4(c), the width in the direction perpendicular to the arrangement direction of the first and second magnet members 64a, 64b may be made longer than the length in the arrangement direction.

In either case, the first and second magnet members 24a, 24b, 44a, 44b, 54a, 54b, 64a, and 64b are parallel to the longitudinal direction of the ring of the first and second ring magnets 23a, 23b, and the end portion thereof in the direction perpendicular to the longitudinal direction is spaced apart from the inner periphery side edge of the ring of the first and second ring magnets 23a, 23b, respectively.

Transparent conductive thin films that can be formed on accordance with the present invention include thin films of various transparent conductive materials; such as, ITO thin film, $SnO_2$ thin film, $ZnO_x$ thin film, and IZO thin film.

Moreover, the constituent material of the target is not limited to transparent conductive materials; and for example, a metal film may be formed on the surface of the object to be film-formed 5 using a target mainly composed of a metallic material, or a protective film may be also formed in the surface of the object to be film-formed using a target mainly composed of insulating materials (such as, silicon oxide and silicon nitride).

Moreover, by sputtering with the use of a material that is highly reactive with the constituent material of a target (e.g., an oxygen gas, a hydrogen gas, a water, or the like, as the reactive gas), a film obtained by the reaction of the constituent material of the target and the reactive gas can be formed on the surface of the object to be film-formed 5. The types of the sputter gas are not limited in particular, and a commonly used sputter gas (such as, Ar, Ne, and Kr) can be used.

As the first to third targets 21a to 21c, the same type may be used or the targets composed of different materials may be used. If the first and second targets 21a, 21b composed of different materials are used, the first thin film is a composite film composed of two or more types of materials; and if the third target 21c which is different from those of the first sputtering chamber 16 is used, a laminated film, in which the second thin film of a composition different from that of the first thin film is formed on the first thin film, can be obtained.

A direct current voltage may be applied to the first and second targets 21a, 21b, or an alternating-current voltage may be applied thereto, or a voltage obtained by superimposing them may be applied thereto. Moreover, the arrangement position of the first and second magnetic field forming devices 15a, 15b is not limited in particular, and they may be arranged outside the vacuum chamber 11 as described above or may be arranged inside the vacuum chamber 11. In the case where the first and second magnetic field forming devices 15a, 15b are arranged outside the vacuum chamber 11, at least a portion of the vacuum chamber 11 (i.e., the portion being sandwiched between the first and second magnetic field forming devices 15a, 15b) is preferably composed of a permeable magnetic material.

EMBODIMENTS

Figure 5:
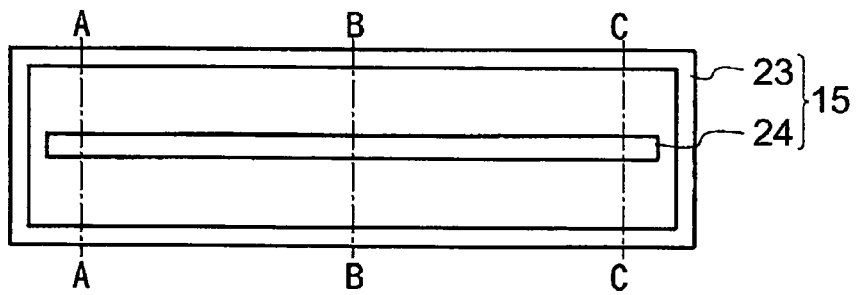
FIG. 5 is a plan view for showing measurement points of an embodiment.

As shown in FIG. 5, a magnetic field forming device 15, wherein a magnet member 24 is arranged inside a ring magnet 23, is arranged so that the N pole of the ring magnet 23 and the N pole of the magnet member 24 are faced toward the rear surface of a target; and among the magnetic fields formed on the surface of the target, the strength of vertical magnetic field components perpendicular to the surface of the target and the strength of horizontal magnetic field components parallel to the surface of the target are measured.

The measurement points of the vertical magnetic field component and horizontal magnetic field component are located at three locations; i.e., positions (A-A, C-C) 50 mm inner side from the edge on the outer peripheral side of both shorter sides of the ring magnet 23, respectively, and a center position (B-B) in the longitudinal direction, and the measurement is made at every 10 mm along the width direction of the ring magnet 23 (FIG. 5).

In addition, for the ring magnet 23, the outer periphery of the ring is in the form of a rectangle (90 mm in width and 340 mm in length), the width of the ring being 10 mm, and the thickness of the ring being 20 mm. The width of the magnet member 24 is 10 mm and the thickness is 20 mm, and the strengths of magnetic fields which the ring magnet 23 and magnet member 24 generate are the same. The distance between the target and the magnetic field forming device 15 is 30 mm.

The measurement result is shown in the following Table 1 and in FIGS. 7(a) to 7(c).

TABLE 1

| | Horizontal magnetic field in the case where a magnet member is arranged | | | | | |
|---|---|---|---|---|---|---|
| | Strength of magnetic field (G) | | | | | |
| Measurement | Center portion | | Upper portion | | Lower portion | |
| point | Horizontal | Vertical | Horizontal | Vertical | Horizontal | Vertical |
| −40 | −75.8 | 330.0 | −59.9 | 310.0 | −57.9 | 330.0 |
| −30 | −87.4 | 309.0 | −77.7 | 308.0 | −76.6 | 314.0 |
| −20 | −55.2 | 284.0 | −45.5 | 284.0 | −42.7 | 294.0 |
| −10 | −29.3 | 294.0 | −24.0 | 289.0 | −13.5 | 307.0 |
| 0 | 16.9 | 307.0 | 8.0 | 301.0 | 31.9 | 312.0 |

TABLE 1-continued

Horizontal magnetic field in the case where a magnet member is arranged

| Measurement point | Strength of magnetic field (G) | | | | | |
|---|---|---|---|---|---|---|
| | Center portion | | Upper portion | | Lower portion | |
| | Horizontal | Vertical | Horizontal | Vertical | Horizontal | Vertical |
| 10 | 70.8 | 280.0 | 56.4 | 275.0 | 76.5 | 273.0 |
| 20 | 87.5 | 247.0 | 73.9 | 248.0 | 82.5 | 252.0 |
| 30 | 91.0 | 262.0 | 85.0 | 263.0 | 85.0 | 270.0 |
| 40 | 77.7 | 310.0 | 72.5 | 311.0 | 70.2 | 300.0 |

In addition, the horizontal axis (measurement point) in FIGS. 7(a) to 7(c) as described above and in FIGS. 8(a) to 8(c) as described later represent the distance from the center in the width direction of the surface of a target.

Figure 6:
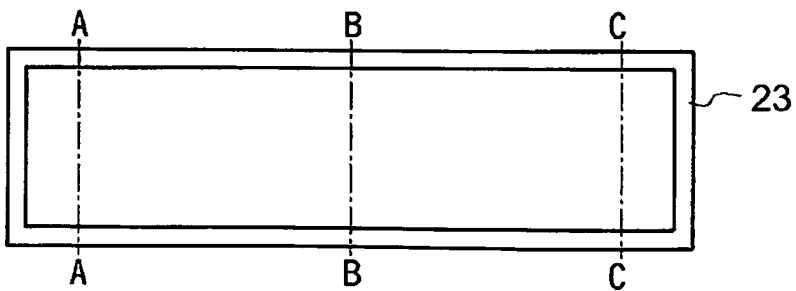
FIG. 6 is a plan view for showing measurement points of a comparative example.

Moreover, as a comparative example, as shown in FIG. 6, also in the case where only ring magnet 23 is arranged in the rear surface of a target without arranging the magnet member inside the ring magnet 23, the horizontal magnetic field components and the vertical magnetic field components are measured at the same positions as the above-described embodiment.

The measurement result is shown in the following Table 2 and in FIGS. 8(a) to 8(c).

TABLE 2

Horizontal magnetic field in the case where only a ring magnet is arranged

| Measurement point | Strength of magnetic field(G) | | | | | |
|---|---|---|---|---|---|---|
| | Center portion | | Upper portion | | Lower portion | |
| | Horizontal | Vertical | Horizontal | Vertical | Horizontal | Vertical |
| −40 | 147.0 | 455.0 | 241.0 | 541.0 | 305.0 | 482.0 |
| −30 | −48.5 | 451.0 | 50.5 | 545.0 | 120.5 | 527.0 |
| −20 | −132.5 | 298.0 | −50.8 | 433.0 | −38.0 | 424.0 |
| −10 | −98.9 | 148.0 | −68.0 | 313.0 | −78.1 | 259.0 |
| 0 | 4.6 | 65.4 | 1.6 | 256.0 | 0.4 | 154.3 |
| 10 | 85.7 | 120.0 | 48.6 | 310.0 | 91.9 | 166.5 |
| 20 | 81.2 | 275.0 | 34.3 | 433.0 | 137.0 | 315.0 |
| 30 | −27.9 | 451.0 | −86.9 | 544,0 | 66.5 | 471.0 |
| 40 | −188.6 | 495.0 | −253.0 | 515.0 | −124.3 | 559.0 |

As apparent from the above-described Tables 1 and 2 and shown in FIGS. 7(a) to 7(c) and FIGS. 8(a) to 8(c), in the case where the magnet member 24 is arranged inside the ring of the ring magnet 23, the strength of the horizontal magnetic field components is in the range of −100 gauss or more and 100 gauss or less in each portion; and in addition, the difference between the maximum value (330 gauss) and the minimum (247 gauss) is 100 gauss or less in the vertical magnetic field components.

In contrast, in the ring magnet 23 without arranging the magnet member, both the horizontal magnetic field and the vertical magnetic field have a large variation in strength; and there are positions where the absolute value of the strength of the horizontal magnetic field component exceeds 200 gauss. In addition, between at the end portion in the width direction of the target and at the center in the width direction, a difference of as much as approximately 400 gauss in the strength of the vertical magnetic field components is produced.

As apparent from the above descriptions, by arranging the magnet member 24 inside the ring magnet 23 and also arranging magnetic poles with the same magnetism on the surface on the target side of the ring magnet 23 and magnet member 24, the absolute value of the strength of the horizontal magnetic field component can be set at 100 gauss or less and the difference between the maximum value and minimum value of the strength of the vertical magnetic field components can be set at 100 gauss or less.

Next, an ITO film is formed on the surface of the object to be film-formed 5 under the following film formation conditions by using the sputtering apparatus 1 in which the first and second magnet members 24a, 24b are arranged inside the ring of the first and second ring magnets 23a, 23b, respectively.

As the object to be film-formed, an unfinished product of an organic EL device is used, and in the method of manufacturing the unfinished product, the surface of a glass substrate, in which Ag/ITO electrodes are patterned, is $O_2$-plasma cleaned first by means of an organic EL manufacturing system (SATELLA manufactured by ULVAC, Inc.), and each layer of the organic EL is formed sequentially by the vapor deposition method to thus obtain the object to be film-formed 5.

For example, 4, 4'-bis [N-(1-naphthyl)-N-phenylamino] biphenyl (hereinafter, abbreviated as NPB) is formed as the hole transport layer in the thickness of 35 nm; and furthermore, a, for example, luminous layer containing 8-oxyquinolino aluminum complex (hereinafter, abbreviated as Alq3) is formed in the thickness of 50 nm, and LiF is formed as a cathode buffer layer in the thickness of 5 nm by vapor deposition.

The object to be film-formed 5 is carried into a nitrogen-displaced glovebox attached to the organic EL manufacturing apparatus, and the object to be film-formed 5 is put into a hermetically-sealed container and the hermetically-sealed container is taken out into the atmosphere. Subsequently, the hermetically-sealed container is brought into an N₂ glovebox attached to the above-described sputtering apparatus 1; the hermetically-sealed container is opened therein to take out the object to be film-formed 5; and the object to be film-formed 5 is set onto the carrier 13 attached to the L/UL chamber 3.

Moreover, a mask for forming ITO electrodes is placed on the surface (surface to be film-formed), in which the buffer layer of the object to be film-formed 5 is formed, and then vacuum evacuating is carried out. Upon reaching a predetermined pressure, the gate valve 41 is opened and the object to be film-formed 5 is carried into the vacuum chamber 11 together with the carrier 13.

Sputtering is carried out with the first and second magnetic field forming devices 15a, 15b being arranged at the rear surface of the first and second targets 21a, 21b; and then, the object to be film-formed 5 is passed through the side of the first and second targets 21a, 21b to form a first thin film composed of ITO film with the film thickness of 20 nm, and is passed through above the third target 21c to form an ITO film with the film thickness of 80 nm on top of the first thin film, and further obtains an organic EL device in which the upper electrode composed of the first and second thin films is formed on the surface of the buffer layer of the object to be film-formed 5.

The deposition conditions of the first and second thin films are as follows: for the opposing cathodes (first and second targets 21a, 21b), the deposition pressure is 0.67 Pa with the sputter gas (Ar gas) of 200 SCCM; and for the parallel plate cathode (third target 21c), the deposition pressure is 0.67 Pa with the sputter gas (Ar gas) of 200 SCCM and the reactive gas (oxygen) of 2.0 SCCM.

The input powers area DC power of 1000 W ($2.1 \text{ W/cm}^2$/cathode) for the opposing cathodes and a DC power of 620 W ($1 \text{ W/cm}^2$) for the parallel plate cathode. The dynamic rates are 2 nm/min for the opposing cathodes and 8 nm/min for the parallel plate cathode. The transporting speed of the object to be film-formed 5 is 0.1 m/min.

The first and second targets 21a, 21b are in the form of a rectangle with 70 mm in width and 330 mm in length. As the first and second magnetic field forming devices 15a, 15b, the same ones as those used in the above-described measurement of magnetic field strength are used.

After carrying out sputtering for a predetermined time, the sputtering is stopped and the first and second targets 21a, 21b are taken out. With respect to the points indicated by the section lines A-A, B-B, and C-C of FIG. 5, the erosion depth is measured from one end to the other end in the width direction of the first and second targets 21a, 21b.

Figure 9:
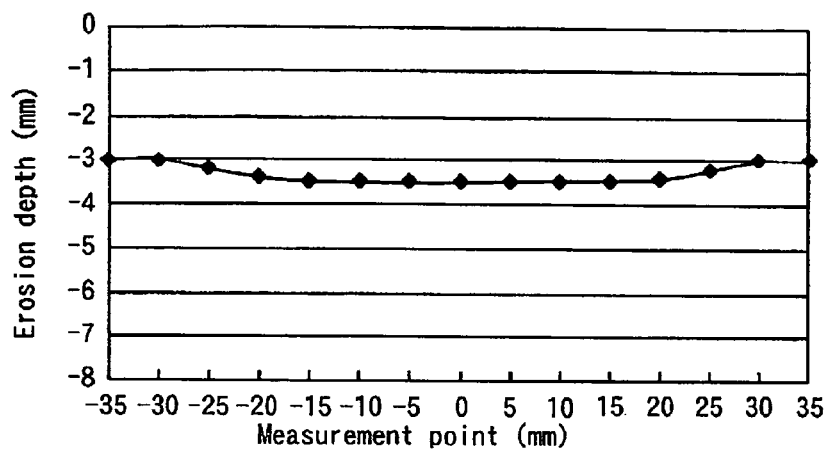
FIGS. 9(a) to 9(c) show erosion distributions after sputtering a target with the sputtering apparatus of the present application.
Figure 9:
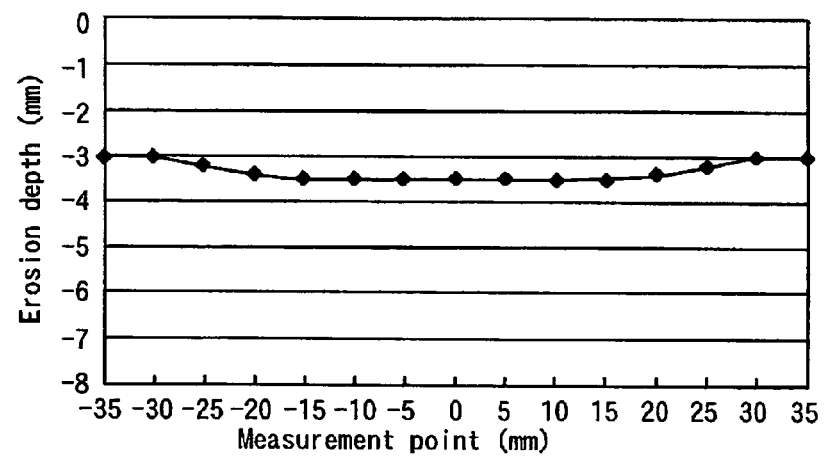
Figure 9:
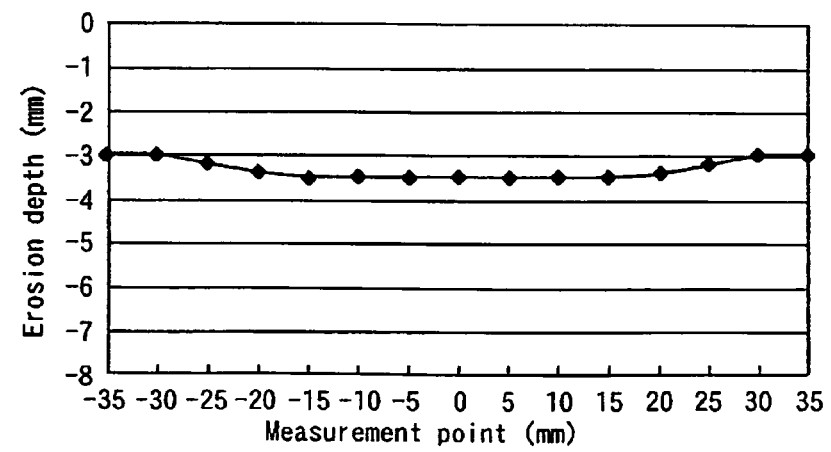
Figure 10:
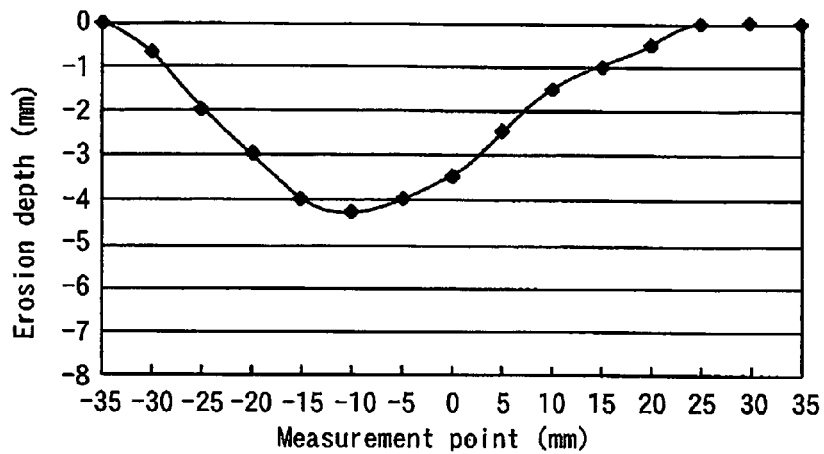
FIGS. 10(a) to 10(c) show erosion distributions after sputtering a target with a sputtering apparatus of the comparative example.
Figure 10:
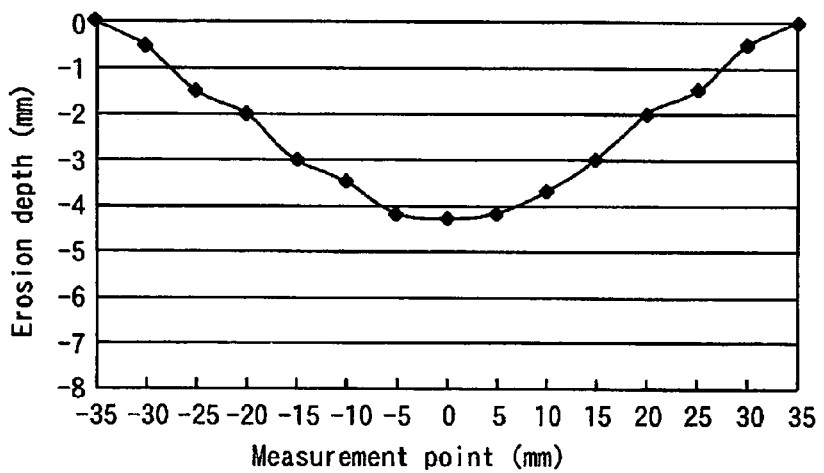
Figure 10:
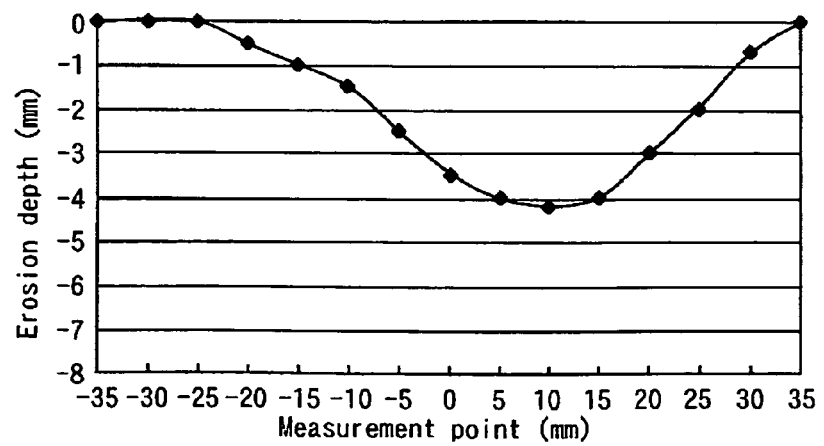

The measured values are described in the following Table 3, and the graphed measurement results are described in FIGS. 9(a) to 9(c), respectively. In addition, in FIGS. 9(a) to 9(c), and FIGS. 10(a) to 10(c) described later, the horizontal axis (measurement point) represents the distance from the center in the width direction of the surface of a target, and the vertical axis (erosion depth) represents the decreased amount of the film thickness of a target.

TABLE 3

| Measurement of erosion depth | | | | | | |
|---|---|---|---|---|---|---|
| Measurement point (mm) | Ring magnet only | | | Inner side magnet with the same polarity is arranged | | |
| | A-A | B-B | C-C | A-A | B-B | C-C |
| 35 | 0 | 0 | 0 | −3.0 | −3.0 | −3.0 |
| 30 | 0 | −0.5 | −0.7 | −3.0 | −3.0 | −3.0 |
| 25 | 0 | −1.5 | −2.0 | −3.2 | −3.2 | −3.2 |
| 20 | −0.5 | −2.0 | −3.0 | −3.4 | −3.4 | −3.4 |
| 15 | −1.0 | −3.0 | −4.0 | −3.5 | −3.5 | −3.5 |
| 10 | −1.5 | −3.7 | −4.2 | −3.5 | −3.5 | −3.5 |
| 5 | −2.5 | −4.2 | −4.0 | −3.5 | −3.5 | −3.5 |
| 0 | −3.5 | −4.3 | −3.5 | −3.5 | −3.5 | −3.5 |
| −5 | −4.0 | −4.2 | −2.5 | −3.5 | −3.5 | −3.5 |
| −10 | −4.3 | −3.5 | −1.5 | −3.5 | −3.5 | −3.5 |
| −15 | −4.0 | −3.0 | −1.0 | −3.5 | −3.5 | −3.5 |
| −20 | −3.0 | −2.0 | −0.5 | −3.4 | −3.4 | −3.4 |
| −25 | −2.0 | −1.5 | 0 | −3.2 | −3.2 | −3.2 |
| −30 | −0.7 | −0.5 | 0 | −3.0 | −3.0 | −3.0 |
| −35 | 0 | 0 | 0 | −3.0 | −3.0 | −3.0 |

Moreover, under the same conditions described above (with the exception of the first and second magnet members 24a, 24b not being arranged inside the ring of the first and second ring magnets 23a, 23b), sputtering is carried out and the erosion depth after the sputtering is measured. The measured values are described in the above Table 3, and the graphed values are described in FIGS. 10(a) to 10(c), respectively.

As apparent from the above-described Table 3 and FIGS. 9(a) to 9(c) and FIGS. 10(a) to 10(c), in the sputtering apparatus 1 of the present embodiment in which the first and second magnet members 24a, 24b are arranged inside the ring of the first and second ring magnets 23a, 23b, respectively, the erosion depth is uniform.

Figure 11:
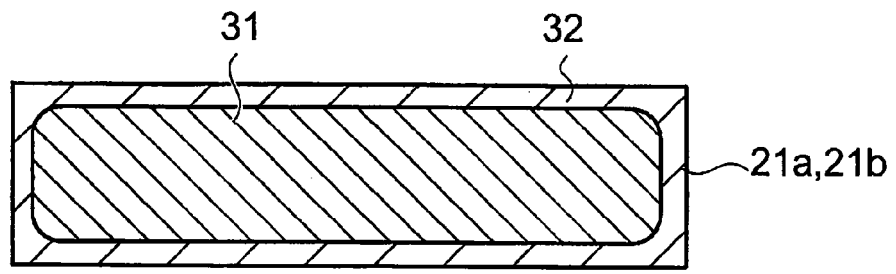
FIG. 11 is a plan view for showing a target after sputtering the target with the sputtering apparatus of the comparative example.
Figure 12:
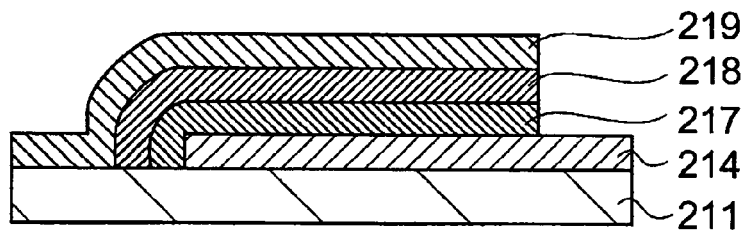
FIG. 12 is a cross-sectional view for illustrating an organic EL device.
Figure 13:
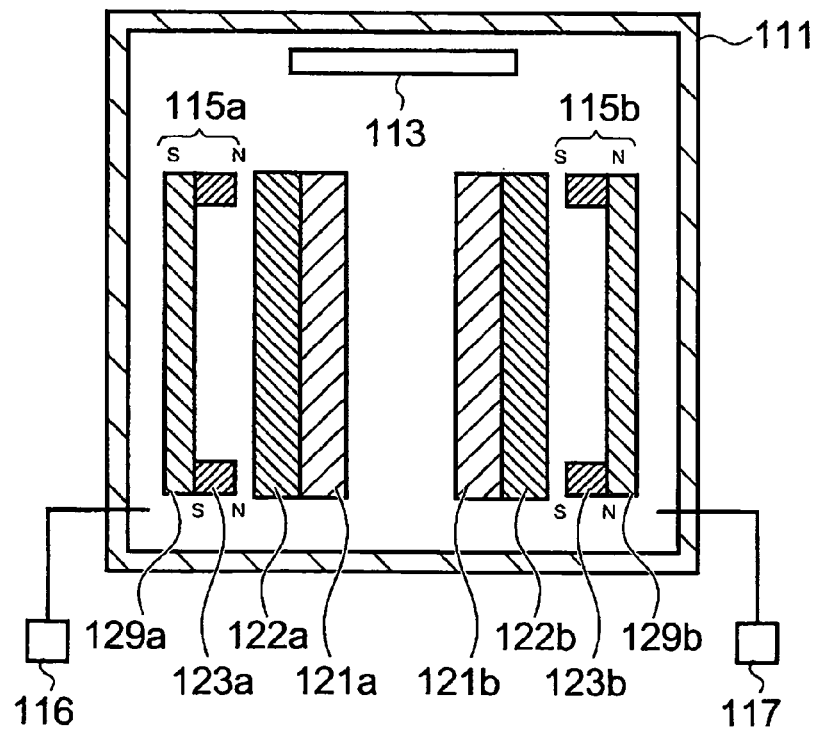
FIG. 13 is a cross-sectional view for illustrating a sputtering apparatus according to a conventional art.

In contrast, when only the first and second ring magnets 23a, 23b are arranged, the erosion depth in the center portion is deeper than the edge portion of the first and second targets 21a, 21b, and the erosion depth is nonuniform. FIG. 11 shows the surface of the first and second targets 21a, 21b after carrying out sputtering with only the first and second ring magnets 23a, 23b being arranged, and in FIG. 11, reference numeral 31 indicates a portion in which the erosion depth is deep and reference numeral 32 indicates a portion in which the erosion depth is shallow. As apparent from the above results, the usage efficiency of the first and second targets 21a, 21b is high in the sputtering apparatus 1 according to the present invention.

What is claimed is:
1. A sputtering apparatus, comprising:
a vacuum chamber;
first and second plate-shaped targets; and
first and second magnets that are magnetized in the thickness direction;
wherein the first and second targets are arranged spaced apart at a predetermined distance in the vacuum chamber while the surfaces of the first and second targets are faced so as to be in parallel to each other, and
the first and second magnets are arranged at a position of the rear surfaces of the first and second targets,
wherein if either S pole or N pole is set to a first magnetic pole and the other is set to a second magnetic pole, then in the first magnet the first magnetic pole is faced toward the rear surface side of the first target, and in the second magnet the second magnetic pole is faced toward the rear surface side of the second target, and sputtered particles are discharged from an opening of a space between the first and second targets toward a surface of an object to be film-formed; and wherein a size of the first magnet is larger than that of the first target, and the first target is arranged inside an inner periphery of the first magnet, and a size of the second magnet is larger than that of the second target, and the second target is arranged inside an inner periphery of the second magnet; and wherein a first magnet member, in which the first magnetic pole is faced toward the rear surface of the first target, is arranged inside the first magnet; and a second magnet member, in which the second magnetic pole is faced toward the rear surface of the second target, is arranged inside the second magnet; and wherein among the strength of magnetic fields formed in the surfaces of the first and second targets, an absolute value of the strength of horizontal magnetic field components parallel to the surface of the first and second targets is set to at most 100 gauss and a difference between an upper limit and lower limit of the strength of vertical magnetic field components perpendicular to the surfaces of the first and second targets is set to at most 100 gauss.

2. The sputtering apparatus according to claim 1, wherein the first and second magnets and the first and second magnet members are relatively stationary with respect to the first and second targets.

* * * * *